United States Patent
Ehm et al.

(10) Patent No.: US 12,140,877 B2
(45) Date of Patent: Nov. 12, 2024

(54) METHOD FOR AVOIDING A DEGRADATION OF AN OPTICAL ELEMENT, PROJECTION SYSTEM, ILLUMINATION SYSTEM AND PROJECTION EXPOSURE APPARATUS

(71) Applicant: Carl Zeiss SMT GmbH, Oberkochen (DE)

(72) Inventors: Dirk Ehm, Beckingen (DE); Wilbert Kruithof, Pleinfeld (DE); Timo Laufer, Stuttgart (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 409 days.

(21) Appl. No.: 17/833,041

(22) Filed: Jun. 6, 2022

(65) Prior Publication Data

US 2022/0308463 A1     Sep. 29, 2022

Related U.S. Application Data

(63) Continuation of application No. PCT/EP2020/083073, filed on Nov. 23, 2020.

(30) Foreign Application Priority Data

Dec. 6, 2019 (DE) ............... 10 2019 219 024.3

(51) Int. Cl.
*H04B 10/00* (2013.01)
*G03F 7/00* (2006.01)

(52) U.S. Cl.
CPC ...... *G03F 7/70916* (2013.01); *G03F 7/70525* (2013.01); *G03F 7/70883* (2013.01)

(58) Field of Classification Search
CPC . H04B 10/112; H04B 10/1123; H04B 10/114; H04B 10/1143; H04B 10/1149;
(Continued)

(56) References Cited

U.S. PATENT DOCUMENTS 8,698,999 B2 * 4/2014 Ehm ............... G03F 7/70916
355/30
9,335,279 B2   5/2016 Delgado
(Continued)

FOREIGN PATENT DOCUMENTS

DE    10061248 A1    6/2002
DE    10209493 A1    10/2003
(Continued)

OTHER PUBLICATIONS

International Search Report, PCT/EP2020/083073, Mar. 2, 2021, 3 pages.
(Continued)

*Primary Examiner* — Hanh Phan
(74) *Attorney, Agent, or Firm* — Edell, Shapiro & Finnan, LLC

(57) ABSTRACT

Method for avoiding a degradation of an optical element, wherein the optical element is arranged in a housing, comprising: a) determining a first degradation value; b) determining a second degradation value, wherein the first degradation value and the second degradation value are determined at different times; c) forming a degradation profile based on the first degradation value and the second degradation value; d) calculating a temporal development of the degradation profile; e) determining at least one predicted degradation value based on the calculated temporal development of the degradation profile; f) comparing the at least one predicted degradation value with a predefinable first limit degradation value; g) monitoring for a predefinable first deviation between the at least one predicted degradation value and the first limit degradation value; h) feeding a first decontamination medium into the interior if attainment of the predefinable first deviation is identified.

22 Claims, 5 Drawing Sheets

(58) Field of Classification Search
CPC ............ H04B 10/0795; H04B 10/1125; H04B 10/1127; H04B 10/1129; G03F 7/70916; G03F 7/70525; G03F 7/70883
USPC ....... 398/118, 119, 120, 121, 122, 123, 124, 398/125, 126, 127, 128, 129, 130, 131, 398/158, 159, 136, 33, 38, 25, 26, 27; 355/30, 53, 67, 70, 71, 77
See application file for complete search history.

(56) References Cited

U.S. PATENT DOCUMENTS

| | | |
|---|---|---|
| 2002/0083409 A1 | 6/2002 | Hamm |
| 2005/0104015 A1 | 5/2005 | Wedowski et al. |
| 2006/0192158 A1 | 8/2006 | Wedowski et al. |
| 2008/0083878 A1 | 4/2008 | Ehm et al. |
| 2010/0068659 A1* | 3/2010 | Hamaya ............ G03F 7/70841 355/53 |
| 2014/0176921 A1 | 6/2014 | Schmidt et al. |
| 2014/0211179 A1 | 7/2014 | von Blanckenhagen et al. |
| 2020/0064748 A1 | 2/2020 | Forcht et al. |

FOREIGN PATENT DOCUMENTS

| | | |
|---|---|---|
| DE | 10 2006 042 987 A1 | 4/2008 |
| DE | 102011079450 A1 | 1/2013 |
| DE | 102011083462 A1 | 3/2013 |
| DE | 102017207030 A1 | 10/2018 |
| WO | 2008023460 A1 | 2/2008 |

OTHER PUBLICATIONS

German Office Action with English translation, Application No. 10 2019 219 024.3, Jul. 13, 2020, 16 pages.

* cited by examiner

METHOD FOR AVOIDING A DEGRADATION OF AN OPTICAL ELEMENT, PROJECTION SYSTEM, ILLUMINATION SYSTEM AND PROJECTION EXPOSURE APPARATUS

CROSS-REFERENCE TO RELATED APPLICATION

This is a Continuation of International Application PCT/EP2020/0083073, which has an international filing date of Nov. 23, 2020, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2019 219 024.3 filed on Dec. 6, 2019.

FIELD

The techniques of this disclosure relate to a method for avoiding a degradation of an optical element, wherein the optical element has a reflective surface, at least regionally, and wherein the optical element is arranged in a housing enclosing an interior.

The disclosed techniques further relate to a projection system for a projection exposure apparatus for EUV lithography, an illumination system for a projection exposure apparatus for EUV lithography, and a projection exposure apparatus.

BACKGROUND

Projection exposure apparatuses for semiconductor lithography serve to produce microstructured components via a photolithographic method. In this case, a structure-bearing mask, the so-called reticle, is imaged onto a photosensitive layer with the aid of a projection optical unit or a projection system. The minimum feature size that can be imaged with the aid of such a projection optical unit is determined by the wavelength of the imaging light used. The shorter the wavelength of the imaging light used, the smaller the structures that can be imaged with the aid of the projection optical unit. At the time of filing of the present disclosure, imaging light of the wavelength 193 nm or imaging light of a wavelength in the extreme ultraviolet range (EUV), i.e., at least 5 nm and at most 30 nm, is used in certain related art lithography devices. When using imaging light of a wavelength of 193 nm, both refractive optical elements and reflective optical elements are used within the projection exposure apparatus. When using imaging light of a wavelength in the EUV range, reflective optical elements, in particular mirrors, are used exclusively, which are typically operated under vacuum conditions in a vacuum environment.

Optical elements of this type usually have a reflective surface, that is to say a reflective coating, which is arranged on a substrate of the optical element. If the wavelength of the imaging light used is in the EUV range of between 5 nm and 30 nm, the reflective coating typically comprises a plurality of individual layers of alternating materials having different refractive indices. Such a multilayer system can comprise alternating silicon and molybdenum layers, for example. During the operation of the projection exposure apparatus, the reflective coating is exposed to EUV radiation that fosters a chemical reaction between the layer materials used and gaseous substances present in a residual gas atmosphere in an interior of the projection exposure apparatus.

In order to protect the individual layers against degradation, a capping layer is typically applied on the reflective coating, which capping layer can consist of ruthenium, for example. However, such a capping layer may also be subject to a degradation, for example an oxidation, as a result of a chemical reaction with residual gas present in the vacuum environment, wherein the chemical reaction is initiated or at least fostered by the EUV radiation. A degradation, for example the oxidation, of the capping layer or of layers arranged below the capping layer during operation of the projection exposure apparatus leads in particular to an undesired reduction of a reflectivity of the respective optical element and thus to a reduction of the total transmission of said optical element.

Methods for avoiding a degradation of an optical element are known from DE 10 2011 079 450 A1, DE 102 09 493 B4, DE 100 61 248 A1, DE 10 2006 042 987 A1 and U.S. Pat. No. 9,335,279 B2.

SUMMARY

Against the above background, the techniques disclosed herein provide for a method, a projection system, an illumination system and a projection exposure apparatus whereby the problems mentioned above may be solved, in particular whereby the degradation of the optical element during operation may be effectively counteracted.

The techniques disclosed herein provide for carrying out a method for avoiding a degradation of an optical element with the following steps: a) determining a first degradation value; b) determining at least one second degradation value, wherein the first degradation value and the at least one second degradation value are determined at different points in time; c) forming a degradation profile based on the first degradation value and the at least one second degradation value; d) calculating a temporal development of the degradation profile; e) determining at least one forecast degradation value (also referred to herein as a "predicted degradation value") based on the calculated temporal development of the degradation profile; f) comparing the at least one forecast degradation value with a predefinable first limit degradation value (also referred to herein as a "predetermined first limit degradation value" or a "predetermined first threshold degradation value"); g) monitoring for a predefinable first deviation (also referred to as a "predeterminable first deviation") between the at least one forecast degradation value and the first limit degradation value; h) feeding a first decontamination medium into the interior if attainment of the predefinable first deviation is identified. The method according to the disclosed techniques having the features described above may have the advantage that a future degree of degradation or degradation state, in particular a degree of degradation or degradation state expected at an arbitrarily predefinable point in time, of the optical element is ascertained or is ascertainable based on the at least one forecast degradation value. Consequently, knowledge both regarding a current degree of degradation and, depending on the forecast degradation value, regarding a future degree of degradation of the optical element may be available. Consequently, depending on the comparison between at least the one forecast degradation value and the first limit degradation value and a deviation that is determined or determinable by the comparison, the fact of whether or not the first decontamination medium ought to be fed to the interior is ascertainable early and in a targeted manner. This ensures reliable and efficient operation of the optical element since the current degree of degradation of the optical element may be regulated or influenced by the feed of the first decontamination medium. The formation of an undesired degradation or an undesired degree of degradation on the optical element may thus be reliably avoided and permanent and continuous operation of the optical element may thus be ensured. In the present case, "degradation" means a loss of desired material properties of the optical element resulting in, for example, a deterioration or a loss of a desired reflectivity. In the present case, "decontamination medium" means a medium that counteracts the degradation.

In accordance with one example of the disclosed techniques, the predefinable first deviation is attained if the forecast degradation value is less than or equal to the first limit degradation value. In other words: The predefinable first deviation is not attained if the forecast degradation value is greater than the first limit degradation value. The first decontamination medium is thus fed to the interior if the forecast degradation value is less than or equal to the first limit degradation value.

In accordance with a further example of the disclosed techniques, the first limit degradation value is chosen in such a way that a critical oxidation of the reflective surface is present if the predefinable deviation is identified, wherein if the predefinable deviation is identified, a first contamination medium comprising a reducing medium is fed to the interior. The advantage here is that attainment or formation of a critical oxidation, and thus of a critical degradation state of the optical element, is identified or is identifiable early. Actual attainment of this critical degradation state, i.e., such that a current degradation state is or becomes a critical oxidation state, can thus be counteracted in a timely and targeted manner by the feed of the first decontamination medium. In the present case, "critical oxidation" means a state of the reflective surface in which the latter is irreversibly oxidized. The reflective surface is irreversibly oxidized for example if a quartz and/or silicon layer that cannot be removed or can be removed only with great effort has formed on said surface. The irreversible oxidation leads to a reduced reflectivity of the optical element and thus to an adverse influence on the lifetime and functionality of said optical element. An oxidation is usually caused by oxygen-containing molecules present in a residual gas atmosphere in the interior of a projection exposure apparatus. The reducing medium is preferably gaseous hydrogen ($H_2$).

In accordance with one development, provision the feed of the first decontamination medium may be stopped if it is detected that the forecast degradation value is greater than the first limit degradation value. This affords the advantage of a particularly efficient and economical use of the first decontamination medium. The first decontamination medium is thus only fed when the forecast degradation value is less than or equal to the first limit degradation value.

In accordance with a further example of the disclosed techniques, the forecast degradation value may be compared with a predefinable second limit degradation value (also referred to herein as a "predetermined second limit degradation value" or a "predetermined second threshold degradation value"), monitoring for a predefinable second deviation (also referred to as a "predeterminable second deviation") between the at least one forecast degradation value and the second limit degradation value is performed, and a second decontamination medium is fed to the interior if attainment of the predefinable second deviation is identified. The advantage here may be that the forecast degradation value is now compared with two limit degradation values and a more accurate monitoring of the optical element for a degradation may be performed. Preferably, the second limit degradation value is greater than the first limit degradation value. Preferably, the first and second decontamination media are different.

In accordance with a further example of the disclosed techniques, the predefinable second deviation is identified if the forecast degradation value is greater than or equal to the second limit degradation value. In other words: The predefinable second deviation is not identified if the forecast degradation value is less than the second limit degradation value. The second decontamination medium is thus fed to the interior if the forecast degradation value is greater than or equal to the second limit degradation value.

In accordance with a further example of the disclosed techniques, the second limit degradation value is chosen in such a way that a critical reduction of the reflective surface is present in the event the predefinable second deviation is attained, wherein if attainment of the predefinable deviation is identified, an oxidizing medium is fed to the interior as a second decontamination medium. The advantage here is that attainment or formation of a critical reduction and thus of a critical degradation state of the optical element is identified or is identifiable early. Actual attainment of this critical degradation state, i.e., such that the current degradation state is or becomes a critical reduction state, can thus be counteracted in a timely and targeted manner by the feed of the second decontamination medium. In the present case, "critical reduction" means a state of the reflective surface in which, on account of a reaction between hydrogen atoms or hydrogen molecules and the reflective surface, a layer removal occurs or has occurred, in particular on account of an etching process resulting from the reaction, or a delamination of the reflective surface, that is to say a delamination of a reflective coating and/or of a capping layer applied on the reflective coating, of the optical element occurs or has occurred. A layer removal or a delamination leads to a loss of desired material properties of the optical element and thus to an adverse influence on the lifetime and functionality of said optical element. A reduction is usually caused by hydrogen present in the residual gas atmosphere in the interior of the projection exposure apparatus. The oxidizing medium is preferably gaseous oxygen ($O_2$), water ($H_2O$) or carbon dioxide ($CO_2$).

In accordance with a further example of the disclosed techniques, provision is made for the feed of the second decontamination medium to be stopped if it is detected that the forecast degradation value is less than the second limit degradation value. This affords the advantage of a particularly efficient and economical use of the second decontamination medium. The second decontamination medium is thus fed exclusively if it is ascertained that the forecast degradation value is greater than or equal to the second limit degradation value.

In accordance with a further embodiment, provision is made for a reflectivity value, a polarization value or a phase value to be determined as a degradation value. The advantage here is that the degradation value is determined based on a parameter which is influenced by the degradation. In this regard, the reflectivity of the optical element changes with, for example, increasing degradation. The reflectivity or a reflectivity value can be determined by, for example, determining a ratio between a light intensity of a light beam incident on the optical element and a light intensity of the light beam reflected at the optical element.

In accordance with a further example of the disclosed techniques, provision is made for the reflectivity value to be determined depending on a determined temperature of the surface of the optical element, a detected duty cycle of a light source that generates working light, a detected clock rate or clock frequency of the light source, a detected pulse energy of at least one, in particular a respective, light pulse generated by the light source and/or a detected partial pressure in the interior. The advantage here is that the reflectivity value is determined depending on one parameter or a plurality of parameters which is/are detectable in a simple manner during EUV operation of a projection exposure apparatus. This enables the reflectivity value and/or degradation value to be determined indirectly, in particular in a model-based manner. The temperature of the surface can be determined by, for example, a temperature sensor or an infrared camera configured to detect radiation signals in the infrared range. The partial pressure in the interior is preferably determined by a residual gas analyser. The partial pressure in the interior is, in particular, the partial pressure of gaseous substances present in the residual gas atmosphere, for example water, oxygen, hydrogen, nitrogen, helium, neon, argon, krypton, xenon, methane ($CH_4$) and/or carbon dioxide ($CO_2$). The duty cycle is preferably determined by detecting a ratio of a pulse duration, in particular the temporal duration of an EUV light pulse, to a pulse period duration, that is to say a temporal interval between two EUV light pulses. In order to be able to determine the duty cycle, provision is preferably made for the light source to be an EUV light source which is operated or operable in a pulsed manner. The pulse energy is preferably detected by a pulse energy detecting unit, for example a photodiode. Alternatively, the pulse energy is predefined. The clock rate or clock frequency, that is to say the number of light pulses generated per second by the light source or EUV light source operated in a pulsed manner, is preferably predefined or predefinable. Optionally, a power of the light source is ascertained depending on the pulse energy and the clock rate. The reflectivity value is then determined depending on the ascertained power.

In accordance with a further example of the disclosed techniques, the temperature is determined depending on the duty cycle and/or depending on the clock rate and the pulse energy. The temperature is thus ascertained taking account of the EUV light energy absorbed by the optical element. The advantage here is that there is no need for additional components for direct temperature measurement, for example a temperature sensor or an infrared camera. In order to determine the temperature depending on the duty cycle, it is preferably provided that a predefinable temperature is or has been assigned to a predefinable ratio of pulse duration to pulse period duration. In order to determine the temperature depending on the clock rate and the pulse energy, it is preferably provided that a predefinable temperature is or has been assigned to a respective detected clock rate in combination with a respective detected pulse energy. For the optional case where a power of the light source is ascertained depending on the pulse energy and the clock rate, that is to say from the product of pulse energy and clock rate, the temperature is determined depending on the power. In order to determine the temperature depending on the power, it is preferably provided that a temperature is or has been assigned to a respective ascertained power. Optionally, a time duration for which the pulsed EUV light source has already been in operation can be taken into account when determining the temperature depending on the duty cycle and/or depending on the clock rate and the pulse energy.

In accordance with a further example of the disclosed techniques, provision is made for the reflectivity value to be determined depending on a predefinable temperature/partial pressure relationship, a predefinable duty cycle/partial pressure relationship (also referred to herein as a "predetermined duty cycle/partial pressure relationship"), a predefinable duty cycle/temperature/partial pressure relationship (also referred to herein as a "predetermined duty cycle/temperature/partial pressure relationship"), a predefinable clock rate/pulse energy/partial pressure relationship (also referred to as a "predetermined clock rate/pulse energy/partial pressure relationship") and/or a predefinable clock rate/pulse energy/temperature/partial pressure relationship (also referred to as a "predetermined clock rate/pulse energy/temperature/partial pressure relationship"). The advantage here is that the reflectivity value is determined particularly reliably based on at least two parameters. A respective relationship or a respective diagram is preferably ascertained experimentally or is predefined. For the optional case where a power of the light source is ascertained depending on the pulse energy and the clock rate, the reflectivity value is determined depending on a predefinable power/partial pressure relationship or a predefinable power/temperature/partial pressure relationship.

In accordance with a further embodiment, the polarization value is determined by ellipsometry. In this case, the optical element is irradiated with, for example, with predefinably polarized light, for example linearly polarized light, and the reflected light is detected by a detector. Afterwards, the polarization state of the reflected light is ascertained and monitored for a change in this polarization state in comparison with the predefinably polarized light. If a change is detected which is greater than a predefinable limit change or maximum allowed change, then a degradation of the surface of the optical element is identified.

In accordance with a further embodiment, the phase value or a phase shift is determined by interferometry. To that end, for example, a predefinable reference interference pattern is compared with an interference pattern determined during the operation of the optical element. Depending on the comparison, in particular depending on a determined deviation of the determined or forecast interference pattern with respect to the reference interference pattern, a degradation of the surface of an optical element can be determined. In the present case, the degradation can be determined particularly advantageously via an in-situ measurement of a wavefront, in particular an amplitude of the wavefront.

In accordance with one development, it is provided that the degradation profile formed based on the first degradation value and the at least one second degradation value is extrapolated in order to calculate the temporal development of the degradation profile. In this case, "extrapolated" means that the degradation profile is extrapolated into the future, in particular to an arbitrarily predefinable future point in time. By way of example, the degradation profile can be extrapolated by a linear function or a polynomial function. Alternatively, the degradation profile can be extrapolated based on a predefinable, preferably experimentally determined, model function. One or else more than one forecast degradation value can be ascertained based on the extrapolated degradation profile.

In accordance with a further example of the disclosed techniques, a point in time until the predefinable first or second deviation is attained is ascertained based on the extrapolated degradation profile. Preferably, for this purpose, the point in time until the predefinable first and/or second deviation or the first or second limit degradation value is attained is ascertained based on a slope or a gradient of the extrapolated degradation profile. Preferably, the feed of the first or second decontamination medium is regulated or adapted depending on the ascertained point in time.

In accordance with a further example of the disclosed techniques, the forecast degradation value is determined in such a way that it has a predefinable temporal distance with respect to the at least one second degradation value. This affords the advantage that the forecast degradation value is known for a predefinable or fixedly ascertained point in time. The temporal distance is, for example, a maximum of one second, in particular a maximum of five seconds, a maximum of 10 seconds, or more. In the present case, "second degradation value" means any degradation value determined last. Depending on the number of degradation values determined, the degradation value determined last can thus also be a third, fourth or a further degradation value.

A projection system including a projection exposure apparatus for EUV lithography having the features of described above may be embodied with a control device configured to carry out the above-described method according to any of the examples discussed herein. The advantages already mentioned are afforded thereby. Further advantages and preferred features are evident from the description above In accordance with one development, provision is made for the optical element to include a capping layer, at least regionally. The capping layer can be formed from zircon, titanium, yttrium, cerium, niobium, molybdenum, vanadium, lanthanum, boron, and/or their oxides, nitrides, carbides, borides and/or silicides and/or from ruthenium, platinum, palladium, iridium, rhodium, gold, silver, osmium, nickel, cobalt, chromium, copper, tungsten and/or molybdenum. The optical element thus includes a capping layer which ensures additional protection against a degradation of the reflective surface.

An illumination system for a projection exposure apparatus for EUV lithography having the features described above may be embodied with a control device configured to carry out the above-described method according to any of examples discussed herein. The advantages already mentioned are afforded thereby. Further advantages and preferred features are evident from the description above.

A projection exposure apparatus for EUV lithography having the features described above may embodied with a control device configured to carry out the above-described methods. The advantages already mentioned are afforded thereby. Further advantages and preferred features are evident from the description above and from the claims.

BRIEF DESCRIPTION OF THE DRAWINGS

The disclosed techniques will be explained in greater detail below with reference to the drawings. In this respect.

DETAILED DESCRIPTION

Figure 1:
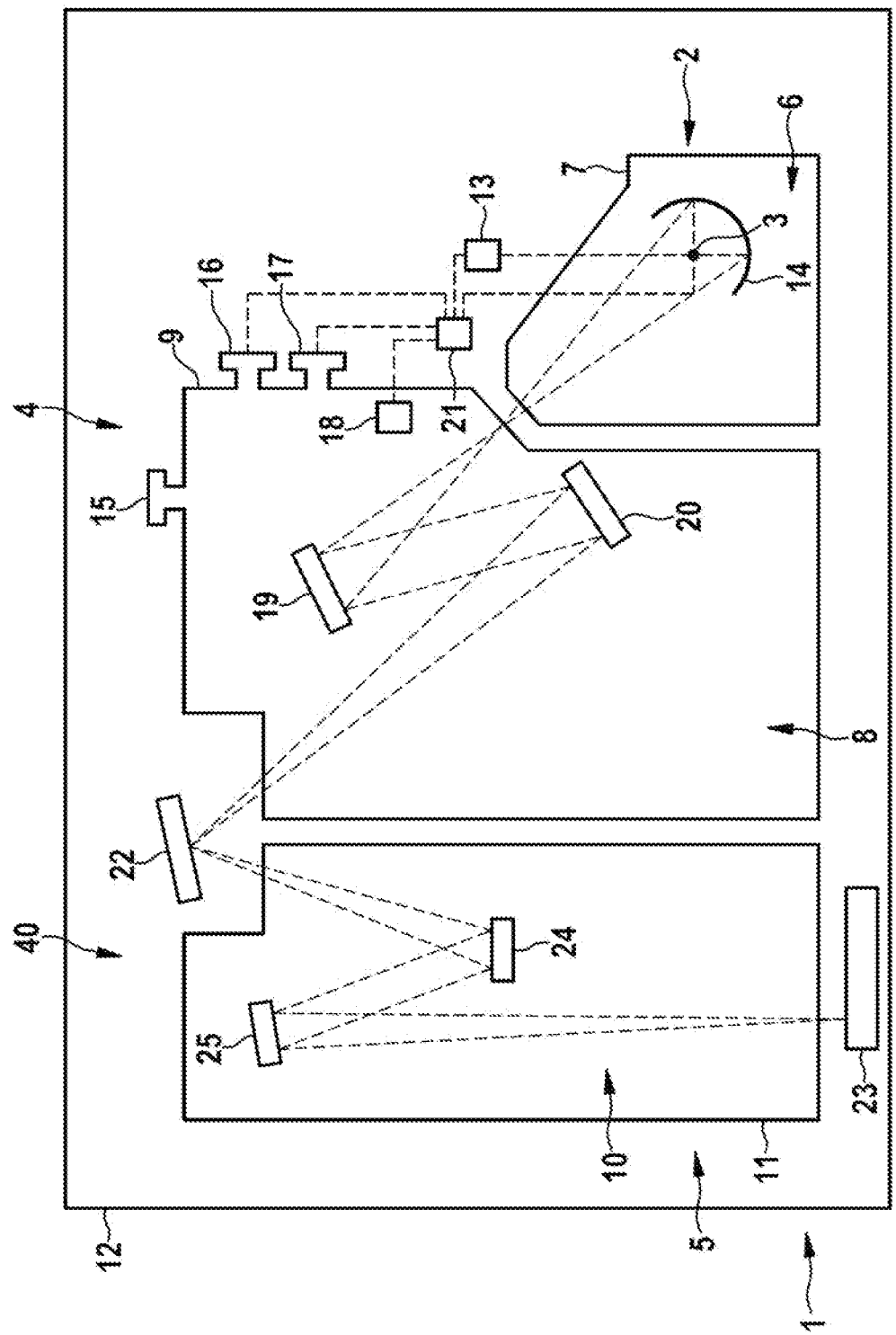
FIG. 1 shows a schematic illustration of a projection exposure apparatus for EUV lithography, according to an example embodiment.

FIG. 1 shows a projection exposure apparatus 1 for EUV lithography or an EUV lithography apparatus in accordance with an example embodiment of the disclosed techniques. The projection exposure apparatus 1 comprises a beam generating system 2 having a controllable light source 3, an EUV light source 3 in the present case, which generates working light, an illumination system 4 and a projection system 5.

In accordance with the present example embodiment, the beam generating system 2 comprises a first housing 7, which encloses an interior 6 of the beam generating system 2 at least regionally, the illumination system 4 comprises a second housing 9, which encloses an interior 8 of the illumination system 4 at least regionally, and the projection system 5 comprises a third housing 11, which encloses an interior 10 of the projection system 5 at least regionally. The first, second and/or third housing 7, 9, 11 are/is embodied in each case as a partial housing of an overall housing 12 of the projection exposure apparatus 1, said overall housing being illustrated merely in a simplified way here.

The projection exposure apparatus 1, in particular the overall housing 12 or the partial housings 7, 9, 11 forming the overall housing 12, is/are operated under vacuum conditions.

In accordance with the present example embodiment, the EUV light source 3 is an EUV light source 3 operated in a pulsed manner, for example a plasma source operated in a pulsed manner or a free electron laser operated in a pulsed manner. "In a pulsed manner" means that the controllable EUV light source 3 is controllable in such a way that it is switched on and off at predefinable, and in particular uniform, time intervals. In the present case, a duty cycle of the EUV light source 3 is detected, that is to say the ratio of a duration of an emitted EUV light pulse to a light pulse period duration, i.e., a temporal distance from one emitted EUV light pulse to a next. For detecting the duty cycle, the projection exposure apparatus 1 or the beam generating device 2 comprises a duty cycle detecting device 13.

As an alternative or in addition to detecting the duty cycle, a clock rate or clock frequency, that is to say the number of EUV light pulses emitted per second by the EUV light source 3, and a pulse energy are detected. In order to detect the clock rate, the projection exposure apparatus 1 or the beam generating device 2 comprises a clock rate detecting device, not illustrated here. Alternatively, the clock rate is predefined or predefinable. Preferably, the clock rate is at least 0 kHz and at most 100 kHz. In order to detect the pulse energy, in particular a respective EUV light pulse emitted by the EUV light source 3, the projection exposure apparatus 1 or the beam generating device 2 comprises a pulse energy detecting device, not illustrated here. The pulse energy detecting device may be embodied as a photodiode, for example, wherein the pulse energy is detected depending on a light intensity of at least one EUV light pulse, in particular of a respective EUV light pulse, which light intensity is detected by the photodiode. Alternatively, the pulse energy is predefined or predefinable. Preferably, the pulse energy is at least 0 mJ and at most 100 mJ.

In the present case, the EUV light emitted by the EUV light source 3, having a wavelength of at least 5 nm and at most 30 nm in the present example embodiment, is focused in a collector mirror 14 of the beam generating device 2 and is then guided into the illumination system 4.

Without being restricted thereto, the illumination system 4 comprises a vacuum generating unit 15 for generating a vacuum in the interior 8 of the partial housing 9, optionally for generating a vacuum in two or all partial housings 7, 9, 11, in particular for generating a vacuum in the overall housing 12. In addition, the illumination system 4 comprises a first controllable decontamination medium reservoir 16 for feeding a first decontamination medium and optionally a second controllable decontamination medium reservoir 17 for feeding a second decontamination medium into at least the interior 8. The first decontamination medium is a reducing medium, for example hydrogen, and the second decontamination medium is an oxidizing medium, for example oxygen, or vice versa.

In addition, the illumination system 4 comprises at least one residual gas analyser 18 and also at least one first and one second optical element 19, 20 embodied as mirrors. The residual gas analyser 18 is, for example, a mass spectrometer, such as a quadrupole spectrometer. The residual gas analyser 18 is configured for detecting a partial pressure in an interior, or one partial pressure or a plurality of partial pressures of gaseous substances present in the residual gas atmosphere, in the present case the residual gas atmosphere in the interior 8 of the housing 9. The gaseous substances are, in particular, substances which can provide for a degradation of the optical elements 19, 20. Substances which can provide for a degradation are, for example, water or water vapour, hydrocarbons, in particular carbon dioxide, oxygen, hydrogen, nitrogen, helium, neon, argon, krypton, xenon, methane ($CH_4$) and/or carbon dioxide ($CO_2$).

Furthermore, the illumination system 4 comprises a control device 21. The control device 21 is connected to the residual gas analyser 18, the EUV light source 3 and the first and second decontamination medium reservoirs 16, 17 to provide control signals thereto. Accordingly, control device 21 may be connected thereto a wire-based or wireless manner. According to the present example, the control device 21 is configured to control the EUV light source 3 and also at least one decontamination medium reservoir, such as the first and/or the optional second decontamination medium reservoir 16, 17. Preferably, the control device 21 is configured in such a way that it fulfils the function of the duty cycle detecting device 13, additionally or alternatively the function of the clock rate detecting device and/or of the pulse energy detecting device. Alternatively, the duty cycle detecting device 13, additionally or alternatively the clock rate detecting device and/or the pulse energy detecting device, is/are a separate ascertaining device connected to the control device 21 in a manner sufficient or provide signalling therebetween.

In the present example, the EUV light introduced into the illumination system 4 is guided by the optical elements 19, 20 onto a photomask 22, or a reticle, having a structure that is imaged onto a wafer 23 on a reduced scale via the projection system 5. For this purpose, the projection system 5 comprises a third and a fourth optical element 24, 25, which are likewise embodied as mirrors.

Optionally, the projection system 5 and also the illumination system 4 each includes only one or three, four, five or more optical elements 19, 20, 24, 25.

Additionally or alternatively, the projection system 5 includes one or a plurality of the components described in association with the illumination system 4, such as the residual gas analyser 18, the first and the optional second decontamination medium reservoir 16, 17, the vacuum generating unit 13 and/or the control device 21.

Additionally or alternatively, the beam generating system 2 includes one or a plurality of the components described in association with the illumination system 4.

In accordance with another example, the control device 21 is embodied as a separate control device 21 and thus in particular as a control device 21 that is assignable to the beam generating system 2, to the illumination system 4 or to the projection system 5.

Alternatively or additionally, the residual gas analyser 18 is configured for determining a partial pressure in the interior 10 of the projection system 5 or in an interior 40 of the overall housing 12. Alternatively or additionally, the first controllable decontamination medium reservoir 16 is configured for feeding the first decontamination medium into the interior 10 of the projection system 5 and the second controllable decontamination medium reservoir 17 is also configured for feeding the second decontamination medium into the interior 10 of the projection system 5.

In the present example, the optical elements are not restricted to mirrors. The photomask 22, or the reticle, a mask holding device, not illustrated here, for holding the photomask 22, for example a mask stage or a so-called reticle stage, and/or the collector mirror 14 should also be understood as optical elements in the present case.

Figure 2:
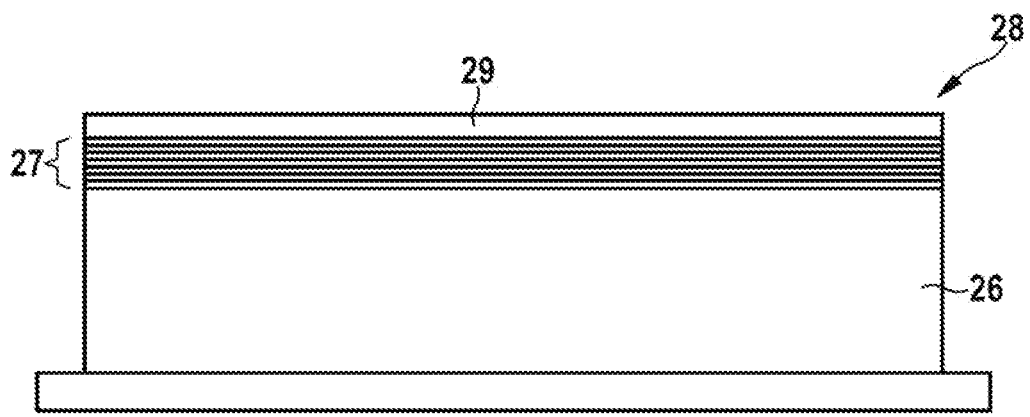
FIG. 2 shows an exemplary illustration of an optical element, according to an example embodiment.

FIG. 2 shows the structure of one or more of the optical elements 19, 20, 24, 25 of the projection exposure apparatus 1 in accordance with an example embodiment. In the present case, the structure is described based on the example of the optical element 19 of FIG. 1.

The optical element 19 includes a substrate 26, which is constructed from a glass material such as, for example, quartz glass or a glass ceramic material, for example ULE® (ultra low expansion) glass, produced by Corning. Alternatively, the substrate 26 may be constructed from a metal, for example copper or aluminium. In the present example, a reflective coating or a multilayer system 27 is applied to the substrate 26. The multilayer system 27 forms the reflective surface 28 of the optical element 19. The multilayer system 27 is applied on that side of the reflective optical element 19 which is exposed to the EUV light.

The multilayer system 27 includes alternating silicon and molybdenum layers. Alternatively, the multilayer system 27 may include, for example, alternating molybdenum and beryllium layers, alternating ruthenium and silicon layers or alternating molybdenum carbide and silicon layers.

The optical element 19 furthermore includes a capping layer 29, which is applied over the multilayer system 27. In the present example, the capping layer 29 is a ruthenium layer. Alternatively, the capping layer 29 may be formed from zircon, titanium, yttrium, cerium, niobium, molybdenum, vanadium, lanthanum, boron, and/or their oxides, nitrides, carbides, borides and/or silicides and/or from platinum, palladium, iridium, rhodium, gold, silver, osmium, nickel, cobalt, chromium, copper, tungsten and/or molybdenum. The capping layer 29 is transmissive or transparent to the EUV radiation. Accordingly, the multilayer system 27 and the capping layer 29 form the reflective surface 28 of the optical element 19 in such example embodiments.

The capping layer 29 serves to protect the multilayer system 27 against a degradation, for example against an oxidation as a result of oxygen contained in the residual gas atmosphere, for example the residual gas atmosphere in the interior 8 of the housing 9. Furthermore, the capping layer 29 protects the multilayer system 27 against a reduction, in particular delamination as a result of, for example, hydrogen contained in the residual gas atmosphere.

Figure 3:
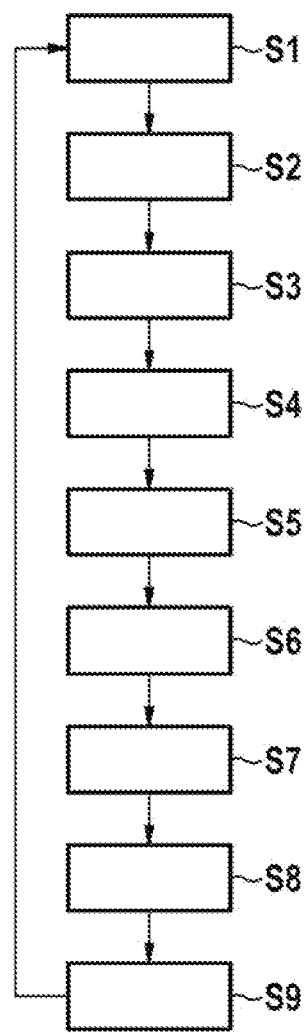
FIG. 3 shows a flow diagram for carrying out a method for avoiding a degradation of the optical element, according to an example embodiment.

FIG. 3 shows a flow diagram for carrying out a method for avoiding a degradation of the optical element in accordance with an example embodiment. The method is preferably carried out by the control device 21. For this purpose, the control device 21 preferably includes a microprocessor, in particular for executing a computer program, the program code of which causes the method described to be carried out, and also a RAM component and a ROM component, wherein preferably data, for example predefinable relationships or diagrams, and programs, for example algorithms and computing programs, are stored on the ROM component. For the sake of simplicity, the method will be described with reference to the optical element 19 of the illumination system 4 of FIG. 1 without being restricted thereto. The method can alternatively or additionally also be carried out on any other optical element described.

A first step S1 involves determining a first degradation value.

In order to determine the first degradation value, a duty cycle of the EUV light source 3 is detected in accordance with the present example embodiment. A temperature of the surface 28 of the optical element 19 is determined depending on the detected duty cycle. The determination is preferably effected via a predefinable duty cycle/temperature relationship stored in the control device 21, in particular, via a relationship in which a temperature is assigned to the detected duty cycle. As an alternative or in addition to detecting the duty cycle, both a clock rate of the EUV light source 3 and a pulse energy of at least one EUV light pulse emitted by the EUV light source 3 are detected in order to determine the first degradation value. Preferably, a power of the EUV light source 3 is ascertained depending on the pulse energy and the clock rate. A temperature of the surface 28 of the optical element 19 is determined depending on the detected clock rate and the detected pulse energy, in particular the power ascertained therefrom. The determination is preferably effected via a predefinable clock rate/pulse energy/temperature relationship stored in the control device 21, in particular, via a relationship in which a temperature is assigned to the detected clock rate in combination with the detected pulse energy. Optionally, the determination is effected via a predefinable power/temperature relationship stored in the control device 21, in particular, via a relationship in which a temperature is assigned to the power ascertained.

In order to determine the first degradation value, a partial pressure in the interior 8 of the second housing 9 of FIG. 1, that is to say the housing of the illumination system 4, is additionally determined in accordance with the present example embodiment. However, the partial pressure can also be determined in the interior of the first and/or third housing 7, 11, or in the interior 40 of the overall housing 12.

A first reflectivity value is determined depending on the determined temperature and the determined partial pressure. The first reflectivity value is the first degradation value in the present example embodiment. The first reflectivity value is determined depending on, for example, a predefinable temperature/partial pressure relationship stored in the control device 21. Alternatively, the reflectivity value is determined depending on a predefinable duty cycle/partial pressure relationship or a predefinable duty cycle/temperature/partial pressure relationship. The temperature/partial pressure relationship, the duty cycle/partial pressure relationship and the duty cycle/temperature/partial pressure relationship are based in each case on experimentally ascertained or predefinable data. Alternatively, first a rate of change in the reflectivity over time is determined based on the determined temperature and the determined partial pressure. The first reflectivity value is then determined by integration of the rate of change over time. If, alternatively or additionally, the clock rate and the pulse energy are detected, then the first reflectivity value may be determined based on a predefinable clock rate/pulse energy/partial pressure relationship and a respective power/partial pressure relationship or a predefinable clock rate/pulse energy/temperature/partial pressure relationship and a respective power/temperature/partial pressure relationship.

A second step S2 involves determining a second degradation value, such as a second reflectivity value. The second degradation value is determined at a temporal distance with respect to the first degradation value. The temporal distance is arbitrarily predefinable. It is possible to determine as many additional degradation values as desired, i.e., at least one third degradation value, at least one fourth degradation value and so on. The second degradation value or reflectivity value is determined analogously to the first degradation value.

A third step S3 involves forming a degradation profile or reflectivity profile based on the first and second degradation values or reflectivity values.

A fourth step S4 involves calculating a temporal development of the degradation profile. In order to calculate the temporal development of the degradation profile, the degradation profile formed based on the first and second degradation values is extrapolated to an arbitrarily predefinable future point in time. The degradation profile can be extrapolated by, for example, a linear function, a polynomial function or a predefinable model function.

A fifth step S5 involves determining a forecast degradation value or a reflectivity value based on the calculated temporal development of the degradation profile. The forecast degradation value is determined in such a way that it has a predefinable temporal distance with respect to the second degradation value. The temporal distance can be one or more milliseconds or one or more seconds. If more than two degradation values or reflectivity values are determined, then the forecast degradation value is determined in such a way that it has a predefinable temporal distance with respect to the degradation value or reflectivity value determined last in the process.

A sixth step S6 involves comparing the forecast degradation value with a predefinable first limit degradation value or limit reflectivity value. In accordance with the present exemplary embodiment, the first limit degradation value is or has been chosen in such that at this value a critical degree of oxidation of the reflective surface 28 or of the capping layer 29 is present. Optionally, provision is made for the forecast degradation value to be compared with two predefinable limit degradation values, that is to say with the first limit degradation value and additionally with a second limit degradation value. Preferably, the second limit degradation value is or has been chosen in such that at this value a critical degree of reduction of the reflective surface 28 or of the capping layer 29 is present.

A seventh step S7 involves monitoring for a predefinable first deviation between the at least one forecast degradation value and the first limit degradation value. If the forecast degradation value is additionally compared with the predefinable second limit degradation value in accordance with the optional embodiment, then monitoring for a predefinable second deviation between the at least one forecast degradation value and the second limit degradation value is additionally effected.

If attainment of the predefinable first deviation is detected or identified, then a first decontamination medium is fed to the interior 8 in an eighth step S8. In the present example, attainment of the predefinable first deviation is identified if the forecast degradation value is less than or equal to the first limit degradation value. Since, in accordance with the exemplary embodiment, the first limit degradation value is chosen in such a way that a critical oxidation of the reflective surface 28 or of the capping layer 29 is present in the event of attainment of the predefinable deviation, a reducing medium as first decontamination medium is fed to the interior 8. In accordance with the optional case where the forecast degradation value is compared with two predefinable limit degradation values, the first decontamination medium is fed to the interior 8 if attainment of the predefinable first deviation is detected. If attainment of the predefinable second deviation is detected or identified, then a second decontamination medium, in particular an oxidizing medium, is fed to the interior 8. Attainment of the predefinable second deviation is identified, in particular, if the forecast degradation value is greater than or equal to the second limit degradation value. Both the first decontamination medium and the second decontamination medium are fed in each case with a predefinable partial pressure.

If it is detected that the forecast degradation value is greater than the first limit degradation value, then the feed of the first decontamination medium is stopped in a step S9. The method is then preferably continued at step S1.

The above-described targeted feed of the first and/or second decontamination medium has the advantage of minimizing an adverse effect on optical properties of the optical element 19 on account of an influence by the respective decontamination medium. Said adverse effect can result, in particular, from EUV light being absorbed by the respective decontamination medium. The targeted feed of the respective decontamination medium thus ensures that absorption on account of the decontamination medium that is fed is particularly short.

Optionally, provision is made for a polarization value or a phase value to be determined as degradation value.

The polarization value is determined by ellipsometry. In this case, the optical element 19 is irradiated for example with predefinably polarized light, for example linearly polarized light, and the reflected light is detected by a detector 30. Afterwards, the polarization state of the reflected light is ascertained and a change in this polarization state in comparison with the predefinably polarized light is examined. A degradation of the surface 28 or of the capping layer 29 of the optical element 19 can be determined based on this change. For the determination by ellipsometry, the projection exposure apparatus 1 preferably comprises a light source 31 that generates predefinably polarized light, and the detector 30. The detector 30 is preferably connected to the control device 21 to provide signalling therebetween.

The phase value is determined by interferometry. To that end, for example, a predefinable reference interference pattern is compared with an interference pattern determined during the operation of the optical element 19. A degradation of the surface 28 or of the capping layer 29 of the optical element 19 can be determined depending on the comparison, in particular depending on a determined deviation of the determined or forecast interference pattern with respect to the reference interference pattern. For the determination by interferometry, the projection exposure apparatus 1 preferably comprises an interferometer 32 and a detector unit 33 for determining the interference patterns. The detector 33 is preferably connected to the control device 21 to provide signalling therebetween.

Figure 4:
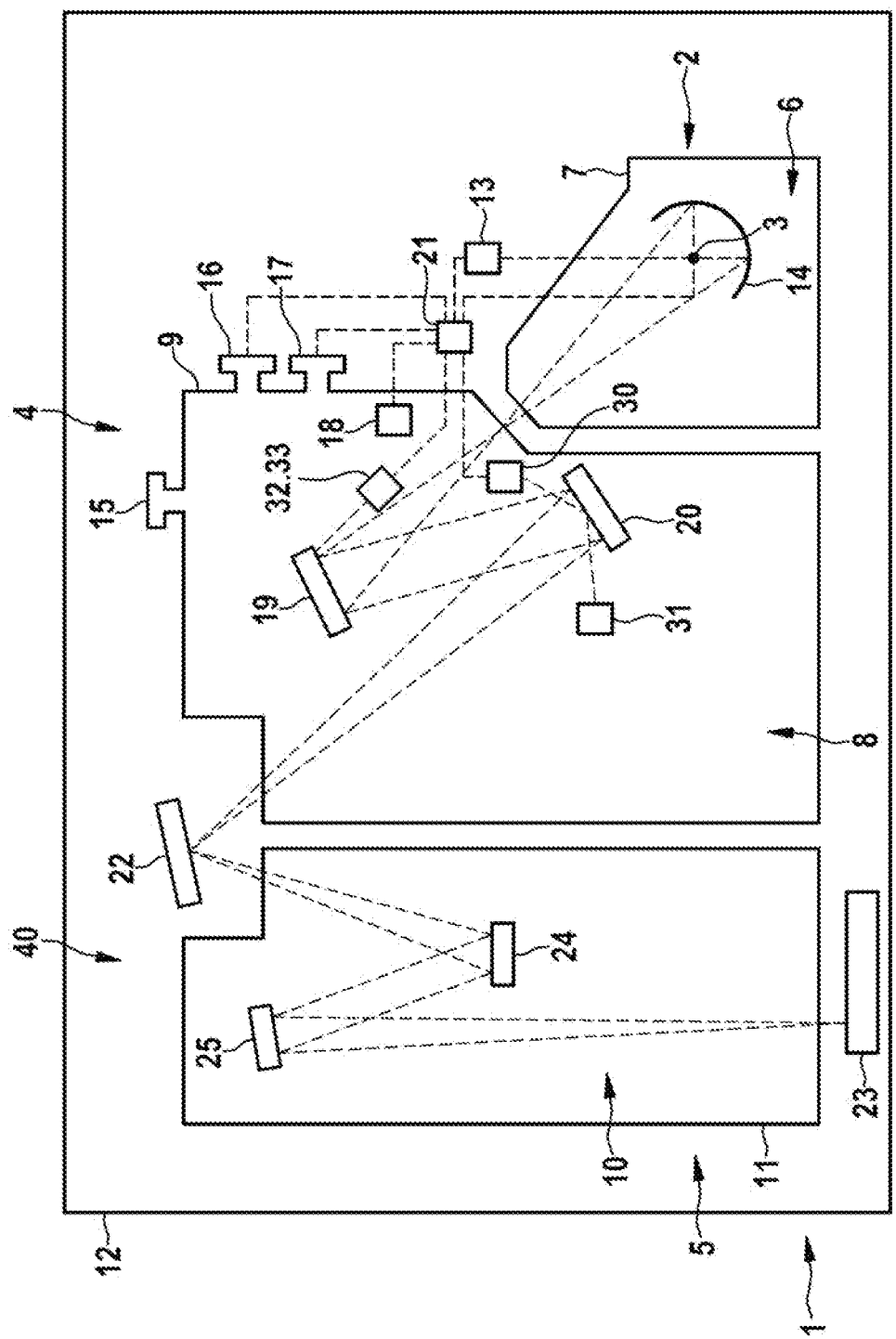
FIG. 4 shows a schematic illustration of a projection exposure apparatus for EUV lithography, according to an example embodiment.

A projection exposure apparatus 1 which enables the polarization values to be determined by ellipsometry and/or the phase value to be determined by interferometry is illustrated in a simplified manner in FIG. 4.

Figure 5:
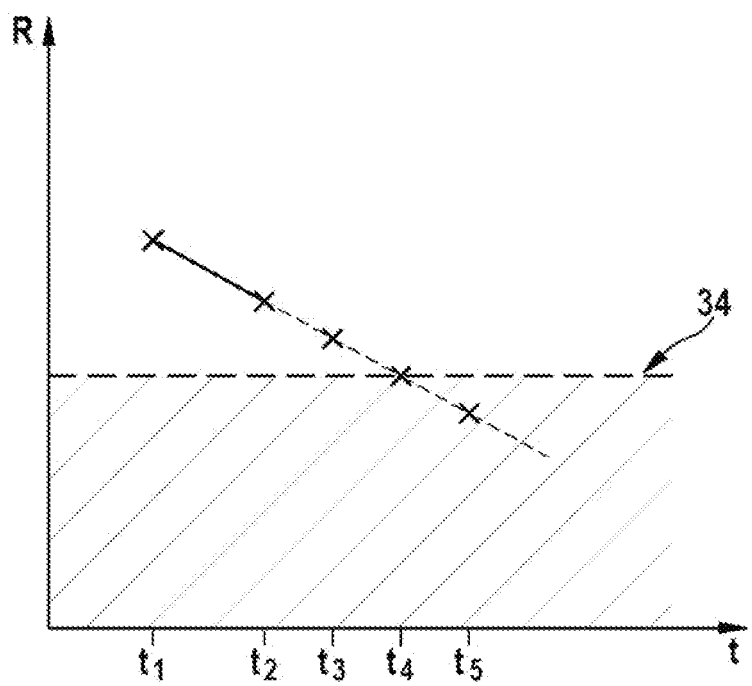
FIG. 5 shows a time/reflectivity value diagram, according to an example embodiment.

FIG. 5 shows, in order to elucidate ascertainment of a forecast degradation value, a time/reflectivity value diagram, not illustrated in a manner true to scale, in accordance with one exemplary embodiment. In this case, time t is plotted on the x-axis of the diagram and the reflectivity R is plotted on the y-axis of the diagram. In accordance with the exemplary embodiment, the reflectivity is a dimensionless number between zero, corresponding to zero percent reflectivity, and one, corresponding to 100 percent reflectivity. Alternatively, a change over time or a rate of change in the reflectivity, that is to say dR/dt, is plotted on the y-axis. Alternatively, the polarization or phase can be plotted on the y-axis.

In the present case, a first degradation value or reflectivity value of, for example—and without being restricted thereto— 0.95, is determined at a first point in time $t_1$ and a second degradation value or reflectivity value of, for example—and without being restricted thereto— 0.94, is determined at a second point in time $t_2$. A degradation profile or reflectivity profile is formed based on the first and second degradation values. A temporal development of the degradation profile is subsequently calculated. In the present case, "temporal development" means a temporal development of the degradation profile which goes beyond the point in time of the degradation value determined last, that is to say the degradation value at $t_2$. The degradation profile is extrapolated in order to calculate the temporal development of the degradation profile.

A forecast degradation value or reflectivity value is determined based on the extrapolated degradation profile (illustrated in a dashed manner in the present case). The forecast degradation value can be determined in such a way that it has a predefinable temporal distance with respect to the at least one second degradation value or degradation value determined last. In the present case, forecast degradation values are ascertained for the points in time $t_3$, $t_4$, $t_5$. At least one, in particular each, of the forecast degradation values is compared with a predefinable first limit degradation value (illustrated in a dashed manner under reference sign 34) or limit reflectivity value, wherein monitoring for a predefinable deviation between the respective forecast degradation value and the first limit degradation value is effected.

In the present case, the limit degradation value is chosen in such a way that a critical, in particular irreversible, oxidation state of the reflective surface 28 or of the capping layer 29 is present in the event of attainment of the deviation, in particular if the forecast degradation value is less than or equal to the limit degradation value. In accordance with the present exemplary embodiment, a critical oxidation is present if the reflectivity of the optical element is 90 percent or less. The first limit degradation value is thus 0.90 in the present case. However, it should be pointed out that the first limit degradation value or limit reflectivity value is arbitrarily selectable or predefinable. In this regard, the limit degradation value or limit reflectivity value can also be 0.95 or 0.85, for example.

In the present case, the forecast degradation value or reflectivity value at the point in time $t_4$ is equal to the limit degradation value. If attainment of the first deviation is identified, the first decontamination medium is fed to the interior 8.

Preferably, a time difference $\Delta t$ or a time interval is ascertained based on the point in time of the degradation value determined last, in the present case the point in time $t_2$, and the point in time at which attainment of the deviation is identified, in the present case the point in time $t_4$. In the present case, the time difference is $\Delta t = t_2 - t_4$. Preferably, the feed, in particular a metering and/or a feed partial pressure, of the first decontamination medium is regulated depending on the time difference $\Delta t$.

Optionally or additionally, the point in time at which the extrapolated degradation profile and thus a forecast degradation value attains the predefinable first limit degradation value is ascertained based on the extrapolated degradation profile. To that end, the degradation profile is extrapolated for an arbitrarily predefinable time duration, for example a maximum of one second, a maximum of five seconds, a maximum of ten seconds or more. The point in time at which the forecast degradation value attains the predefinable first limit degradation value is then the point in time at which the forecast degradation profile intersects the limit degradation value. A targeted determination of the point in time at which the forecast degradation value attains the predefinable first limit degradation value is thus ensured.

Figure 6:
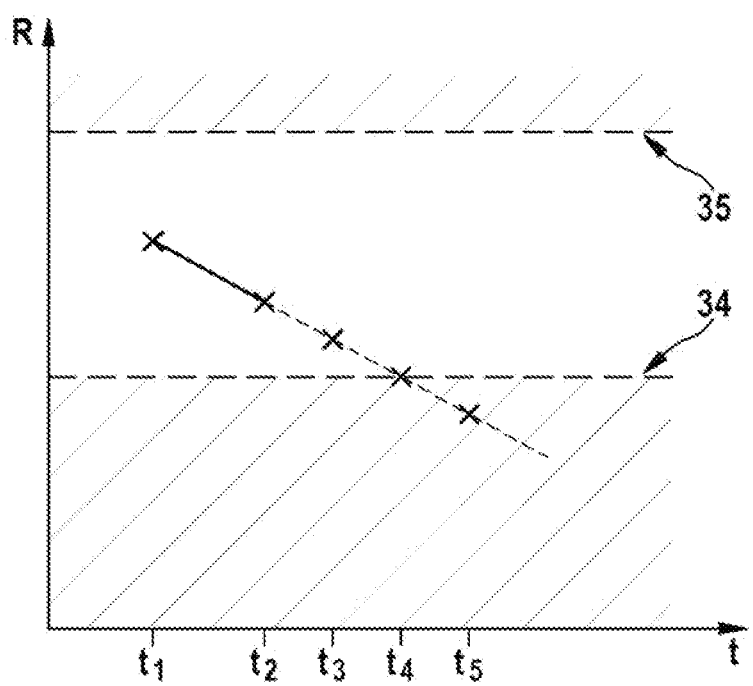
FIG. 6 shows a time/reflectivity value diagram, according to an example embodiment.

FIG. 6 shows a time/reflectivity value diagram, not illustrated in a manner true to scale, in accordance with a further exemplary embodiment. The difference with respect to the time/reflectivity value diagram from FIG. 5 is that a predefinable second limit degradation value or limit reflectivity value (illustrated in a dashed manner under reference sign 35) is additionally depicted in the present case.

In the present case, the second limit degradation value is chosen in such a way that a critical, in particular irreversible, reduction state of the reflective surface 28 or of the capping layer 29 is present if the forecast degradation value is greater than or equal to the second limit degradation value. In accordance with the present exemplary embodiment, a critical reduction is present if the reflectivity of the optical element is 100 percent or more. The second limit degradation value or limit reflectivity value is thus 1.00 in the present case. If it is identified that the forecast degradation value is greater than or equal to the second limit degradation value, a second decontamination medium, in particular an oxidizing medium, is fed to the interior 8.

The use of two limit degradation values has the advantage that the degradation value of the optical element 19 is settable or regulatable in such a way that it lies between the first and second limit degradation values and thus in a defined process window or monitoring range. This ensures that the optical element 19 remains in an acceptable range with regard to its degree of degradation.

It should be pointed out that the second limit degradation value or limit reflectivity value is arbitrarily selectable or predefinable and is not restricted to the exemplary embodiment above. Preferably, provision is made for the second limit degradation value to be greater or to be chosen to be greater than the first limit degradation value.

Figure 7:
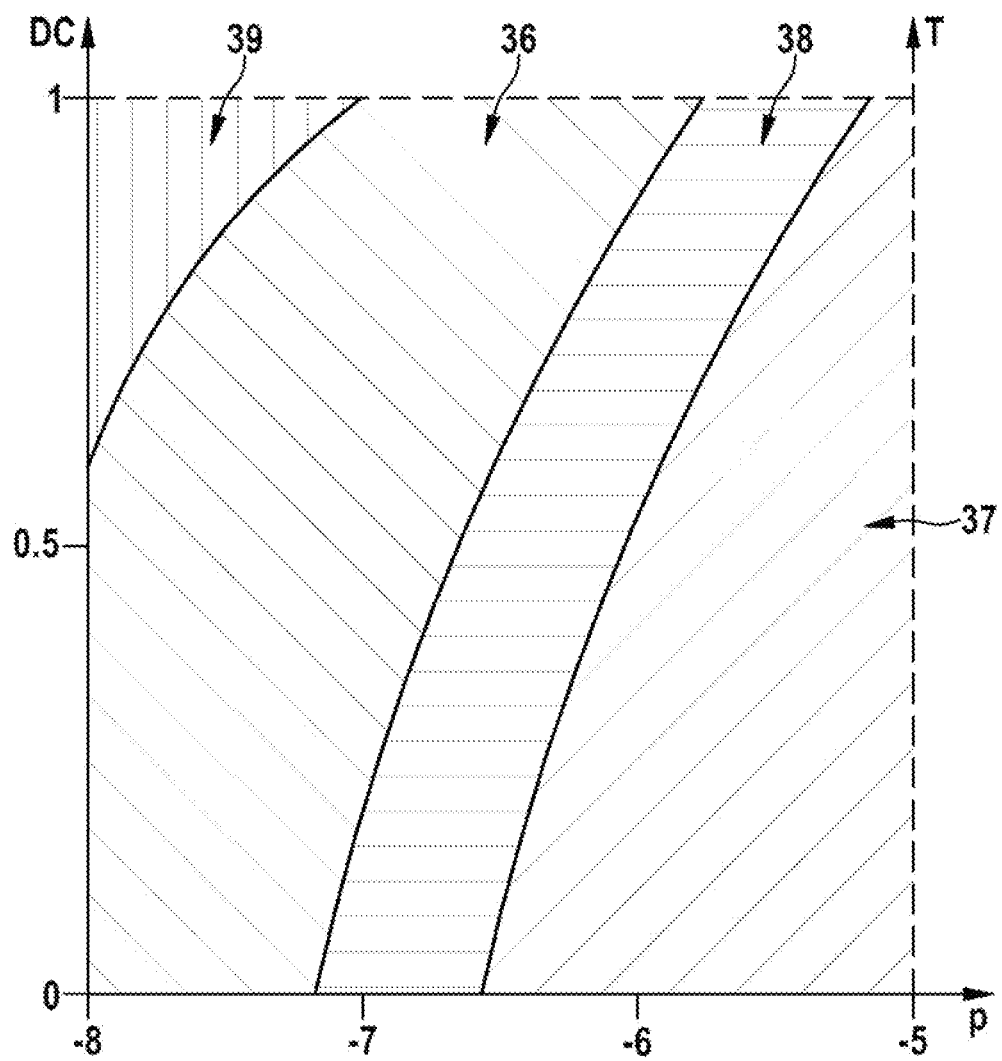
FIG. 7 shows a duty cycle/partial pressure relationship, according to an example embodiment.

FIG. 7 shows, in order to elucidate ascertainment of a degradation value or reflectivity value, a duty cycle/partial pressure relationship or a duty cycle/partial pressure diagram in accordance with one exemplary embodiment. In this case, the partial pressure p, for example of water or water vapour, is plotted on the x-axis of the diagram and the duty cycle DC of the EUV light source 3 operated in a pulsed manner is plotted on the y-axis of the diagram. A degradation value, in the present case a reflectivity value, is determined depending on the partial pressure and the duty cycle. Alternatively, a rate of change in the reflectivity is determined depending on the partial pressure and the duty cycle. A reflectivity value can then be determined by integration of the rate of change.

The partial pressure is specified in millibar, for example—and without being restricted thereto—in a range of from at least $10^{-8}$ millibar to at most $10^{-5}$ millibar. Alternatively, the partial pressure can lie for example in a range of from at least $10^{-9}$ to at most $10^4$ millibar.

The duty cycle is specified in a value range of 0 to 1 or 0 to 100 percent. As already described, the temperature of the surface 28 of the optical element 19 can be ascertained depending on the duty cycle. Alternatively or additionally, the temperature can thus also be plotted on the y-axis. Preferably, a temporal duration for which the EUV light source 3 operated in a pulsed manner has already been in operation is taken into account for ascertaining the temperature depending on the duty cycle. In particular, this takes account of the fact that with the duty cycle remaining constant, as the operating duration of the EUV light source 3 increases, the temperature of the surface 28 increases. The development of the temperature depending on both the operating duration and the duty cycle is preferably ascertained experimentally or predefined.

A degradation value or reflectivity value is assignable to a respectively determined partial pressure/duty cycle combination. Depending on the partial pressure/duty cycle combination, the degradation values or reflectivity values can lie in an acceptable range, in particular an acceptable reductive range (illustrated at 36), a critical oxidative range (illustrated at 37), a transition range (illustrated at 38) between reductive and oxidative ranges, or a critical reductive range (illustrated at 39).

By way of example, a first partial pressure/duty cycle combination is determined in order to determine the first degradation value or reflectivity value and a second partial pressure/duty cycle combination is determined in order to determine the at least one second degradation value. Based on the first degradation value and the at least one second degradation value, then the degradation profile is formed and a temporal development of the degradation profile is calculated.

As an alternative or in addition to ascertaining the degradation value or reflectivity value depending on the duty cycle, the degradation value is ascertained depending on the power, that is to say the product of clock rate and pulse energy. In this case, the degradation value is ascertained via a power/partial pressure relationship or a clock rate/pulse energy/partial pressure relationship. If the degradation value is ascertained depending on the power, then the power is plotted on the y-axis.

In the present case, the power can be specified in a value range of zero watts to 10 000 watts. As already described, the temperature of the surface 28 of the optical element 19 can be determined depending on the power or the clock rate and the pulse energy. Consequently, the temperature can likewise be plotted on the y-axis in this case. Preferably, a temporal duration for which the EUV light source 3 operated in a pulsed manner has already been in operation is taken into account for determining the temperature depending on the power or the clock rate and the pulse energy. In particular, this takes account of the fact that with the power remaining constant, as the operating duration of the EUV light source 3 increases, the temperature of the surface 28 increases. The development of the temperature depending on both the operating duration and the power is preferably ascertained experimentally or predefined.

A degradation value or reflectivity value is assignable to a respectively determined power/partial pressure combination. By way of example, a first power/partial pressure combination is determined in order to determine the first degradation value or reflectivity value and a second power/partial pressure combination is determined in order to determine the at least one second degradation value. Based on the first degradation value and the at least one second degradation value, then the degradation profile is formed and a temporal development of the degradation profile is calculated.

LIST OF REFERENCE SIGNS

1 Projection exposure apparatus
2 Beam generating system
3 EUV light source
4 Illumination system
5 Projection system
6 Interior
7 first housing
8 Interior
9 second housing
10 Interior
11 third housing
12 Overall housing
13 Duty cycle ascertaining device
14 Collector mirror
15 Vacuum generating unit
16 first decontamination medium reservoir
17 second decontamination medium reservoir
18 Residual gas analyser
19 first optical element
20 second optical element
21 Control device
22 Photomask
23 Wafer
24 third optical element
25 fourth optical element
26 Substrate
27 Multilayer system
28 Surface
29 Capping layer
30 Detector
31 light source that generates polarized light
32 Interferometer
33 Detector
34 first limit degradation value
35 second limit degradation value
36 reductive range
37 oxidative range
38 Transition range
39 critical reductive range
40 Interior

What is claimed is:

1. A method for avoiding a degradation of an optical element, wherein the optical element has a reflective surface, at least regionally, and wherein the optical element is arranged in a housing enclosing an interior,
the method comprising:
a) determining a first degradation value,
b) determining at least one second degradation value, wherein the first degradation value and the at least one second degradation value are determined at different points in time,
c) forming a degradation profile based on the first degradation value and the at least one second degradation value,
d) calculating a temporal development of the degradation profile,
e) determining at least one predicted degradation value based on the calculated temporal development of the degradation profile,
f) comparing the at least one predicted degradation value with a predetermined first limit degradation value,
g) monitoring for a predeterminable first deviation between the at least one predicted degradation value and the predetermined first limit degradation value, and
h) feeding a first decontamination medium into the interior in response to identifying the predeterminable first deviation.

2. The method of claim 1, wherein identifying the predeterminable first deviation comprises determining that the at least one predicted degradation value is less than or equal to the predetermined first limit degradation value.

3. The method of claim 2, wherein the predetermined first limit degradation value is chosen in such a way that a critical oxidation of the reflective surface is present in the event of attainment of the predeterminable first deviation, and wherein the first decontamination medium comprises a reducing medium.

4. The method of claim 2, wherein the feeding the first decontamination medium is stopped in response to determining that the at least one predicted degradation value is greater than the predetermined first limit degradation value.

5. The method of claim 1, further comprising comparing the at least one predicted degradation value with a predetermined second limit degradation value, monitoring for a predeterminable second deviation between the at least one predicted degradation value and the predetermined second limit degradation value, and feeding a second decontamination medium into the interior in response to identifying the predeterminable second deviation.

6. The method of claim 5, wherein identifying the predeterminable second deviation comprises determining that the at least one predicted degradation value is greater than or equal to the predetermined second limit degradation value.

7. The method of claim 6, wherein the predetermined second limit degradation value is chosen in such a way that a critical reduction of the reflective surface is present in the event of attainment of the predeterminable second deviation, and wherein the second decontamination medium comprises an oxidizing medium.

8. The method of claim 7, further comprising reducing or stopping the feeding the second decontamination medium in response to determining that the at least one predicted degradation value is less than the predetermined second limit degradation value.

9. The method of claim 1, wherein the first degradation value or the at least one second degradation value comprises a reflectivity value, a polarization value or a phase value.

10. The method of claim 9, wherein the reflectivity value is determined from a temperature of the reflective surface of the optical element, a detected duty cycle of a light source that generates working light, a detected clock rate of the light source, a detected pulse energy of at least one light pulse generated by the light source and/or a detected partial pressure in the interior.

11. The method of claim 10, wherein the temperature is determined depending on the detected duty cycle and/or depending on the detected clock rate and the detected pulse energy.

12. The method of claim 9, wherein the reflectivity value is determined depending on a predetermined temperature/partial pressure relationship, a predetermined duty cycle/partial pressure relationship, a predetermined duty cycle/temperature/partial pressure relationship, a predetermined clock rate/pulse energy/partial pressure relationship and/or a predetermined clock rate/pulse energy/temperature/partial pressure relationship.

13. The method of claim 9, wherein the polarization value is determined by ellipsometry.

14. The method of claim 9, wherein the phase value is determined by interferometry.

15. The method of claim 1, wherein forming the degradation profile comprises extrapolating the first degradation value and the at least one second degradation value to calculate the temporal development of the degradation profile.

16. The method of claim 15, wherein a time at which the predeterminable first or second deviation is attained is determined based on the degradation profile extrapolated from the first degradation value and the at least one second degradation value.

17. The method of claim 1, wherein determining the at least one predicted degradation value comprises determining the at least one predicted degradation value such that the at least one predicted degradation value has a predetermined temporal distance with respect to the at least one second degradation value.

18. An illumination system for a projection exposure apparatus for EUV lithography, comprising:
   a housing enclosing an interior,
   at least one optical element arranged in the housing,
   at least one vacuum generating unit for generating a vacuum in the interior of the housing,
   at least one controllable decontamination medium reservoir for feeding a decontamination medium into the housing,
   a control device, and
   at least one of the following elements:
      a duty cycle detecting device for detecting a duty cycle of a light source of the projection exposure apparatus,
      a pulse energy detecting unit for detecting a pulse energy of a light pulse generated by the light source,
      a clock rate detecting device for detecting a clock rate of the light source, or
      a residual gas analyser for detecting a partial pressure in the interior;
   wherein the control device is configured to carry out the method according to claim 1 based upon on a detected duty cycle, a detected pulse energy, a detected clock rate and/or the partial pressure.

19. A projection system for a projection exposure apparatus for EUV lithography, comprising:
   a housing enclosing an interior,
   at least one optical element arranged in the housing,
   at least one vacuum generating unit for generating a vacuum in the interior of the housing,
   at least one controllable decontamination medium reservoir for feeding a decontamination medium into the housing,
   a control device, and
   at least one of the following elements:
      a duty cycle detecting device for detecting a duty cycle of a light source of the projection exposure apparatus,
      a pulse energy detecting unit for detecting a pulse energy of a light pulse generated by the light source,
      a clock rate detecting device for detecting a clock rate of the light source, or
      a residual gas analyser for detecting a partial pressure in the interior;
   wherein the control device is configured to carry out the method according to claim 1 depending on a detected duty cycle, a detected pulse energy, a detected clock rate and/or the partial pressure.

20. A projection exposure apparatus for EUV lithography, comprising:
   an illumination system,
   a projection system,
   a light source,
   at least one controllable decontamination medium reservoir,
   a control device, and
   at least one of the following elements:
      a duty cycle detecting device for detecting a duty cycle of the light source of the projection exposure apparatus,
      a pulse energy detecting unit for detecting a pulse energy of a light pulse generated by the light source,
      a clock rate detecting device for detecting a clock rate of the light source, or
      a residual gas analyser for detecting a partial pressure in the interior of at least one partial housing of the projection exposure apparatus;
   wherein the control device is configured to carry out the method according to claim 1 depending on a detected duty cycle, a detected pulse energy, a detected clock rate and/or the partial pressure.

21. Projection exposure apparatus of claim 20, wherein the control device comprises the duty cycle detecting device and/or the pulse energy detecting unit.

22. A projection exposure apparatus for EUV lithography, comprising:
   an illumination system,
   a projection system,
   a light source,
   at least one controllable decontamination medium reservoir,
   a control device, and
   one of the following elements:
      a detector for detecting polarized light which is generated by the light source, or
      an interferometer and a detector for determining interference patterns,
   wherein the control device is configured, when used as intended, to carry out the method according to claim 1 depending on a detected polarized light or a determined interference pattern.

* * * * *

UNITED STATES PATENT AND TRADEMARK OFFICE
CERTIFICATE OF CORRECTION

| | | |
|---|---|---|
| PATENT NO. | : 12,140,877 B2 | Page 1 of 1 |
| APPLICATION NO. | : 17/833041 | |
| DATED | : November 12, 2024 | |
| INVENTOR(S) | : Ehm et al. | |

It is certified that error appears in the above-identified patent and that said Letters Patent is hereby corrected as shown below:

In the Specification

Column 1, Lines 9-10, delete "PCT/EP2020/0083073," and insert -- PCT/EP2020/083073, --.

Column 7, Line 21, delete "above" and insert -- above. --.

Column 16, Line 11, delete "$10^4$" and insert -- $10^{-4}$ --.

Signed and Sealed this
Thirteenth Day of May, 2025

Coke Morgan Stewart
*Acting Director of the United States Patent and Trademark Office*